(12) United States Patent
Rodrigues et al.

(10) Patent No.: US 11,846,833 B2
(45) Date of Patent: Dec. 19, 2023

(54) OPTICAL METASURFACES EMBEDDED ON HIGH CTE SURFACE

(71) Applicant: TOYOTA MOTOR ENGINEERING & MANUFACTURING NORTH AMERICA, INC., Plano, TX (US)

(72) Inventors: Sean P. Rodrigues, Ann Arbor, MI (US); Ercan Mehmet Dede, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 420 days.

(21) Appl. No.: 17/232,972

(22) Filed: Apr. 16, 2021

(65) Prior Publication Data
US 2022/0334413 A1    Oct. 20, 2022

(51) Int. Cl.
*G02B 1/00* (2006.01)
*G02F 1/00* (2006.01)
(Continued)

(52) U.S. Cl.
CPC ........... *G02F 1/0054* (2013.01); *G02B 1/002* (2013.01); *G02F 1/0147* (2013.01);
(Continued)

(58) Field of Classification Search
CPC ............... G02F 1/0054; G02F 2202/30; G02F 2202/36; G02B 1/002; G02B 1/007; H01L 31/0543
See application file for complete search history.

(56) References Cited

U.S. PATENT DOCUMENTS

2010/0295173 A1*  11/2010  Chang ................... H01L 21/563
                                                        524/424
2011/0163636 A1*  7/2011  Sirbuly .................. H10N 30/30
                                                        29/25.35
(Continued)

FOREIGN PATENT DOCUMENTS

CN        104916920 B      4/2018
CN        106873082 B      10/2020
(Continued)

OTHER PUBLICATIONS

Yanhan Zhu, et al., "Tunable dual-band terahertz metamaterial bandpass filters", Optics Letters, vol. 38, Issue 14, 2013, pp. 2382-2384 (Abstract only).
(Continued)

*Primary Examiner* — Christopher Stanford
*Assistant Examiner* — Journey F Sumlar
(74) *Attorney, Agent, or Firm* — Oblon, McClelland, Maier & Neustadt, L.L.P.

(57) ABSTRACT

An optical metasurface which shifts resonant frequency in response to changing temperature. The optical metasurface includes a membrane printed in a pattern from materials with a high coefficient of thermal expansion ("CTE"). The optical metasurface can include a plurality of high CTE fibers/structures in a first direction and a plurality of low CTE fibers/structures in a second direction perpendicular to the first direction. Alternatively, the high CTE substrate can include a plurality of high CTE fibers/structures in only a first direction. The high CTE substrate can include a plurality of high CTE fibers and a plurality of low CTE fiber in a pattern which creates desired sensing domains. An array of nanostructures is formed on the high CTE substrate. The array of nanostructures is designed to resonate with light transmitted through or impinging upon the optical metasur- (Continued)

face. The resonant frequency of the response can be tuned thermally.

20 Claims, 15 Drawing Sheets

(51) Int. Cl.
*H01L 31/054* (2014.01)
*G02F 1/01* (2006.01)

(52) U.S. Cl.
CPC ...... *H01L 31/0543* (2014.12); *G02F 2202/30* (2013.01); *G02F 2202/36* (2013.01)

(56) References Cited

U.S. PATENT DOCUMENTS

| | | | |
|---|---|---|---|
| 2012/0212824 A1* | 8/2012 | Sakurai | G01J 3/51 359/579 |
| 2013/0084037 A1* | 4/2013 | Xia | G01N 21/45 977/932 |
| 2013/0269336 A1* | 10/2013 | O'Connell | F03G 7/005 60/527 |
| 2015/0083899 A1* | 3/2015 | Morgan | H01L 31/0543 362/346 |
| 2017/0142825 A1 | 5/2017 | Hada et al. | |
| 2019/0267345 A1* | 8/2019 | Kabir | H01L 21/4853 |
| 2021/0164839 A1* | 6/2021 | Hong | G01J 5/0808 |

FOREIGN PATENT DOCUMENTS

| | | |
|---|---|---|
| JP | 2018-174252 A | 11/2018 |
| KR | 0180486 B1 | 3/1999 |

OTHER PUBLICATIONS

Ben-Xin Wang, et al., "Temperature tunable metamaterial absorber at THz frequencies", Journal of Materials Science: Materials in Electronics, vol. 28, Feb. 25, 2017, pp. 8487-8493 (Abstract only).

Lingling Wu, et al., "Dielectric meta-atom with tunable resonant frequency temperature coefficient", Scientific Reports, vol. 7, Article No. 2566, May 31, 2017, 6 pages Guoping Lei, et al., "Design and simulation of a temperature-tunable terahertz metamaterials based on $VO_2$ particles", Results in Physics, vol. 14, No. 102405, Sep. 2019, pp. 1-7.

Shoufeng Lan, et al., "Dark plasmonic modes in diatomic gratings for plasmoelectronics", Laser & Photonics Reviews, vol. 11, Issue 2, Mar. 10, 2017, 4 pages (Abstract only).

Salvatore Campione, et al., "What is an epsilon-near-zero mode?", Advanced Photonics, OSA Technical Digest (Optical Society of America), Jun. 27-Jul. 1, 2015, 4 pages (Abstract only).

Mohammad Taghinejad, et al., "Photocarrier-Induced Active Control of Second-Order Optical Nonlinearity in Monolayer $MoS_2$,", Natural Sciences, Small, vol. 16, Issue 5, Jan. 14, 2020, 3 pages (Abstract only).

Iñigo Liberal, et al., "Reconfigurable epsilon-near-zero metasurfaces via photonic doping", Nanophotonics, 2018, pp. 1-11.

A. Kosiorek, et al., "Shadow Nanosphere Lithography: Simulation and Experiment", Nano Letters, vol. 4, No. 7, 2004, pp. 1359-1363.

Tadatoshi Kurogi, et al., "Haptic PLASTeR: soft, thin, light and flexible haptic display using DEA composed of slide-ring material for daily life", ACM Siggraph Emerging Technologies, Article No. 15, Jul. 2019, pp. 1-2 (Abstract only).

Danqing Liu, et al., "Protruding organic surfaces triggered by in-plane electric fields", Nature Communications, vol. 18, Issue 1526, Nov. 15, 2017, pp. 1-6.

Danqing Wang, et al., "Stretchable Nanolasing from Hybrid Quadrupole Plasmons", Nano Letters, vol. 18, No. 7, Jun. 18, 2018, pp. 4549-4555 (Abstract only).

Seyedeh Mahsa Kamali, et al., "Highly tunable elastic dielectric metasurface lenses", Laser & Photonics Reviews, vol. 10, Issue 6, Nov. 3, 2016, pp. 1002-1008 (Abstract only).

Ho-Seok EE, et al., "Tunable Metasurface and Flat Optical Zoom Lens on a Stretchable Substrate", Nano Letters, vol. 16, No. 4, Mar. 17, 2016, pp. 2818-2823 (Abstract only).

Akihiro Takezawa, et al., "Design methodology for porous composites with tunable thermal expansion produced by multi-material topology optimization and additive manufacturing", Composites Part B, vol. 131, 2017, pp. 21-29.

* cited by examiner

OPTICAL METASURFACES EMBEDDED ON HIGH CTE SURFACE

BACKGROUND

Field of the Invention

The present disclosure provides optical metasurfaces which shift resonance frequency in response to changing temperature.

Description of the Related Art

An optical metamaterial is a type of electromagnetic metamaterial that interacts with light, covering infrared (IR) or visible wavelengths. The materials employ a periodic, cellular structure. In a conventional material, the response to electric and magnetic fields, and hence to light, is determined by the effective permittivity and permeability of the composing materials. Crystalline materials offer a periodic arrangement of atoms, this crystal shape and periodicity provides for a homogenized description on the macroscope scale to light of wavelengths that are much larger than the periodicity of the unit cell. In comparison, metamaterials utilize periodic unit cells that are roughly on the order of the wavelength of interest or smaller. This allows for tailoring of the permittivity and permeability to yield an effective medium model.

Optical metamaterials are composite materials which have physical properties of negative refractive index, negative magnetic permeability, negative dielectric constant and the like which exceed those of conventional materials. Optical metamaterials can be applied to functional devices, such as nano waveguides, surface plasmon photonic chips, filters, couplers, modulators and switches and may be used in applications of super-diffraction limited high-resolution imaging, nano photoetching, biosensors and detectors, solar cells, lenses, military stealth materials and the like.

The field of optical metamaterials has developed rapidly over the past two decades. Optical metamaterials exhibit strong responses to optical magnetic fields and may yield negative refraction. Structured optical metamaterials may be engineered to generate tailored responses to a stimulus. This field has grown to encompass research in optics, electromagnetics, acoustics and hybrid material responses.

The spacing between the cells of an optical metamaterial array defines the resonant frequency response of the array. Physical stretching of the optical metamaterial changes the resonant frequency response. The resonant frequency response is described by the effective medium model which changes upon stretching.

Accordingly, it is one object of the present disclosure to provide an optical metamaterial which shifts resonant frequency in response to changing temperature.

SUMMARY

The present disclosure describes an optical metasurface which shifts resonant frequency in response to changing temperature. The optical metasurface includes a membrane including a pattern of materials with a high coefficient of thermal expansion ("CTE").

In an embodiment, the high CTE substrate includes a plurality of high CTE structures in a first direction and a plurality of low CTE structures in a second direction perpendicular to the first direction.

In an embodiment, the high CTE substrate includes a plurality of high CTE structures in a first direction.

In another embodiment, the high CTE substrate includes a pattern of high and low CTE structures.

In an embodiment, the optical metasurface includes an array of nanostructures embedded in the membrane.

In another embodiment, the optical metasurface having the pattern of structures expands in response to applied heating.

In a further embodiment, the applied heating is an increase in ambient temperature.

In an embodiment, the applied heating is applied by a resistive heater attached to the high CTE substrate.

In an embodiment, the optical metasurface expands or contracts in response to cooling.

In an embodiment, the cooling is applied by exposing the optical metasurface to ambient temperature.

In an embodiment, the cooling is applied by wind generated by a fan.

In an embodiment, the cooling is applied by a cold water bath.

In an embodiment, the optical metasurface is attached to a solar cell.

In another embodiment, the optical metasurface is attached to a solar cell array.

In a further embodiment, the optical metasurface is attached to a solar panel.

In yet another embodiment, the optical metasurface forms a split ring resonator which can be turned on and off by thermal heating.

In another embodiment, the optical metasurface forms a variable focal length lens which changes focal point by thermal heating.

In yet another embodiment, the optical metasurface forms a split ring resonator which can be turned on and off by thermal cooling.

In an embodiment, the optical metasurface is patterned with interdigitated fingers which provide a spectral response from laser interrogation, which response can be tuned by the application of thermal heating.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1A:
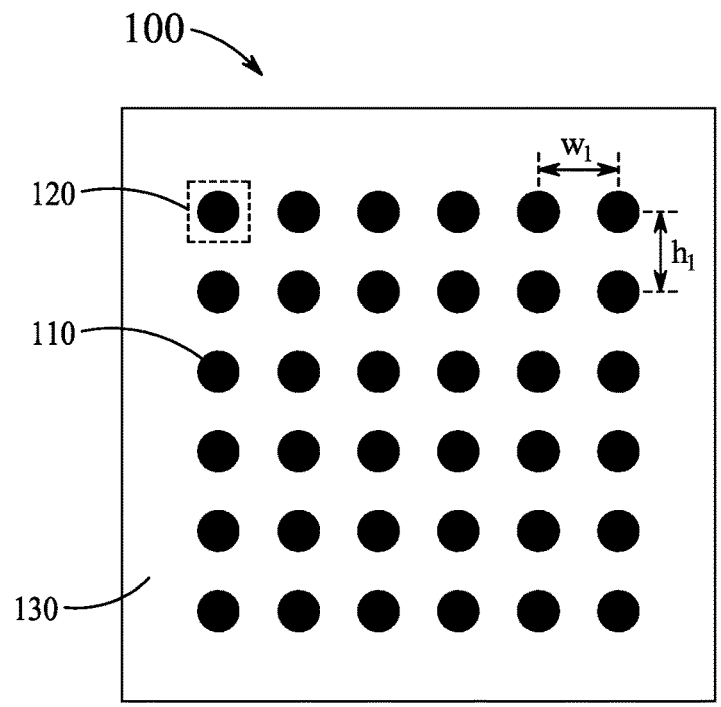
FIG. 1A shows a schematic top plan view of an electroactive optical metasurface in an inactivated mode, according to certain embodiments.

Referring now to the drawings, wherein like reference numerals designate identical or corresponding parts throughout the several views.

Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

As defined in the present disclosure, the term "fibers" may include a pattern of lithographically or 3D printed materials, including nanostructures, nanofibers, metals, organic materials, inorganic materials and polymers.

Aspects of this disclosure are directed to an optical metasurface, a method of tuning a resonant frequency and a method of fabricating an optical metasurface.

Embodiments of the present disclosure include optical metasurfaces having shifting resonance frequencies in response to temperature changes. For example, resonance frequencies may undergo a red shift (e.g., have a decreasing resonance frequency) with increasing temperature or a blue shift (e.g., have an increasing resonance frequency) with decreasing temperature.

Most optical metasurfaces consist of metallic nanostructure arrays applied to rigid substrates. A photonic metamaterial (PM), also known as an optical metamaterial, is a type of electromagnetic metamaterial, that interacts with light, covering terahertz (THz), infrared (IR) or visible wavelengths. These materials employ a periodic, cellular structure.

Photonics is the physical science of light (photon) generation, detection, and manipulation through emission, transmission, modulation, signal processing, switching, amplification, and sensing.

The subwavelength periodicity distinguishes photonic metamaterials from photonic band gap or photonic crystal structures. The cells are on a scale that is magnitudes larger than the atom, yet much smaller than the radiated wavelength, are on the order of nanometers.

The optical metamaterials of the present disclosure are formed with a flexible membrane which is configured to expand or contract with increasing temperature, thus adjusting the periodicity of the nanostructure lattice.

FIG. 1A depicts a top plan view of an electroactive optical metasurface of the present disclosure. Optical metamaterials of the present disclosure may include a repeating optically active array 100 including a plurality of resonators 110 disposed on a surface of a substrate 130 which has a high coefficient of thermal expansion ("CTE"). The resonators are separated by a width, $w_1$, and a height, $h_1$. Each resonator 110 embedded in the high CTE substrate 130 is considered to be a unit cell 120.

Figure 1B:
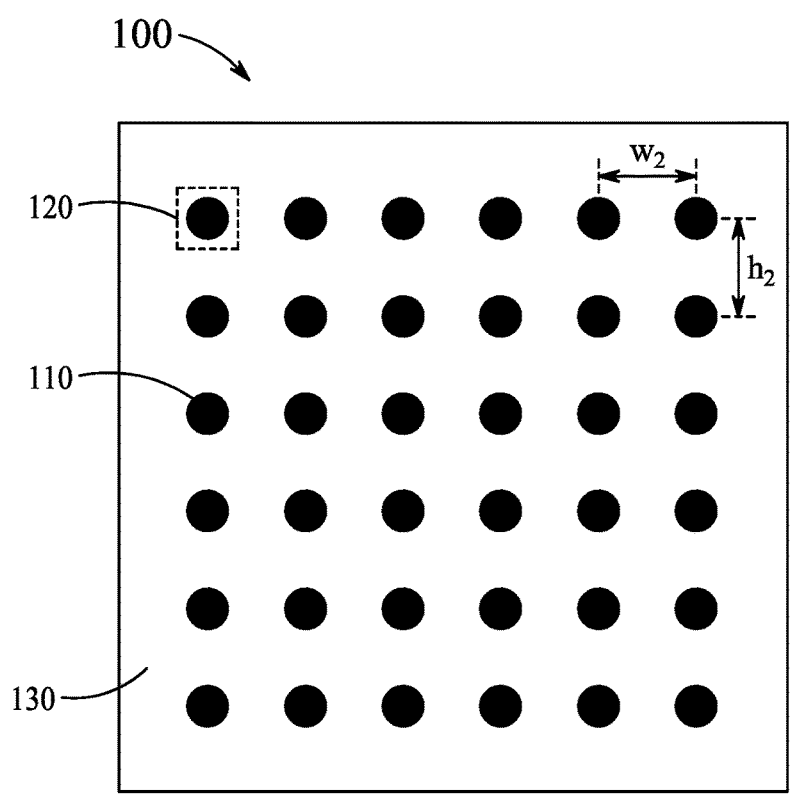
FIG. 1B shows a schematic top plan view of the electroactive optical metasurface in activated mode, according to certain embodiments.

FIG. 1A depicts an optical metamaterial at a relatively low (e.g., cool) temperature, while FIG. 1B depicts the optical metamaterial at a higher temperature than FIG. 1A. As shown in FIG. 1B, the high CTE substrate 130 may anisotropically expand in both the width and height dimensions with increasing heat, causing an increased spacing (or period) of the optically active array. This increase in array period may cause the resonance frequency of the metamaterial to decrease. Conversely, cooling the metamaterial may cause the resonance frequency to increase.

In FIG. 1B, the higher temperature has caused the high CTE substrate to expand so that $w_2$ is greater than $w_1$ and $h_2$ is greater than $h_1$. If $w_1=h_1$, and the high CTE substrate 130 is isotropic, then $w_2=h_2=w_1+\Delta w_1$. However, if the high CTE substrate is anisotropic, then $w_2=w_1+\Delta w_1$ and $h_2$ $h_1+\Delta h_1$.

In an aspect of the present disclosure, the high CTE material may be a negative thermal expansion (NTE) material or a positive thermal expansion (PTE) material. In a material having a positive thermal coefficient of expansion (TCE), the material expands with increasing heat. In a material having a negative TCE, the substrate contracts upon application of increasing heat. Carbon Fiber has a low, negative coefficient of thermal expansion (CTE) in the area of $-1\times10^{-6}$/K to $+8\times10^{-6}$/K. The mean transverse CTE varies from $5\times10^{-6}$ K$^{-1}$ to $10\times10^{-6}$ K$^{-1}$ and the longitudinal CTE varies from $1.6\times10^{-6}$ K$^{-1}$ to $2.1\times10^{-6}$K$^{-1}$ depending on the fiber structural properties. Composites with Zero CTE can be achieved with a combination of matrix material and carbon fiber. High modulus carbon fibers with more than 530 GPa in modulus have an advantage to provide Zero CTE composites in fabric and isotropic laminates.

In aspects of the present disclosure, the high CTE substrate 130 is constructed of a metal or other high CTE material, patterned on a membrane, such as polydimethylsiloxane (PDMS). PDMS is characterized by its low surface tension, low modulus (contributing to its biological consistency), hydrophobicity, thermal and electrical stability. Due to the limited range of possible configurations of cast and molded shapes, the high CTE material may be 3D printed with PDMS.

The high CTE substrate comprises a planar surface on which the optically active array 100 is disposed. The optically active array 100 can include resonators 110 of metal particles, such as gold or other plasmonic materials, disposed on the substrate. The metal particles may be nanospheres. In some aspects of the present disclosure, the array is constructed from inorganic resonators like silicon, alumina or titanium dioxide, or organic resonators (e.g., formed of a polymer such as Poly [1, 2-dithiole-3-thion-4(5)-thio]: poly (styrenesulfonate) (PDTT: PSS). Each resonator may be disposed in a unit cell 120. PSS has high ion exchange properties.

Figure 2A:
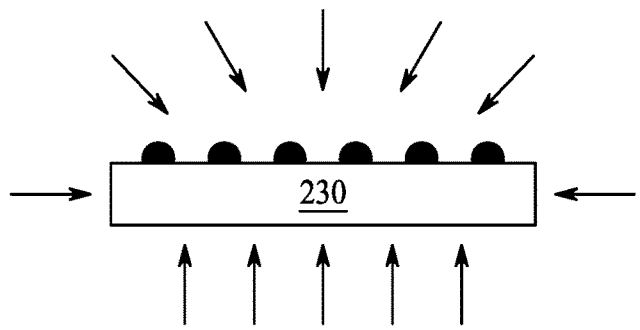
FIG. 2A shows a cross-sectional view of the electroactive optical metasurface heated by the ambient temperature, according to certain embodiments.
Figure 2B:
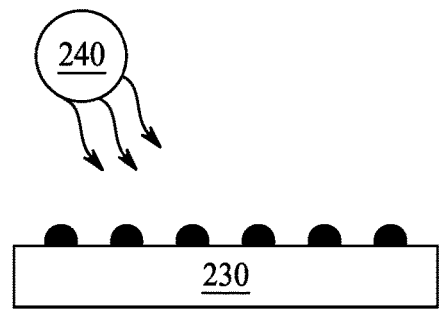
FIG. 2B shows a cross-sectional view of the electroactive optical metasurface heated by the applied light, according to certain embodiments.

The thermal increase may be applied in a variety of ways. In FIG. 2A, the high CTE substrate 230 is shown warmed by a uniform increase in the ambient temperature. In FIG. 2B, the high CTE substrate may warmed by a lighting source 240, such as sunlight or as an effect of applied lighting, such as a laser. In another aspect, the high CTE substrate may be attached to a resistive wiring layer 250 to which electricity is applied by a voltage controller 260. FIG. 2D shows an example of a resistive wiring layer 252 connected to the voltage controller 260.

The high CTE substrate will typically expand in x and y dimensions with increasing heat, by forming the substrate of perpendicular structures, formed of a high CTE material in one dimension, and structures of low CTE in the perpendicular direction.

Figure 3A:
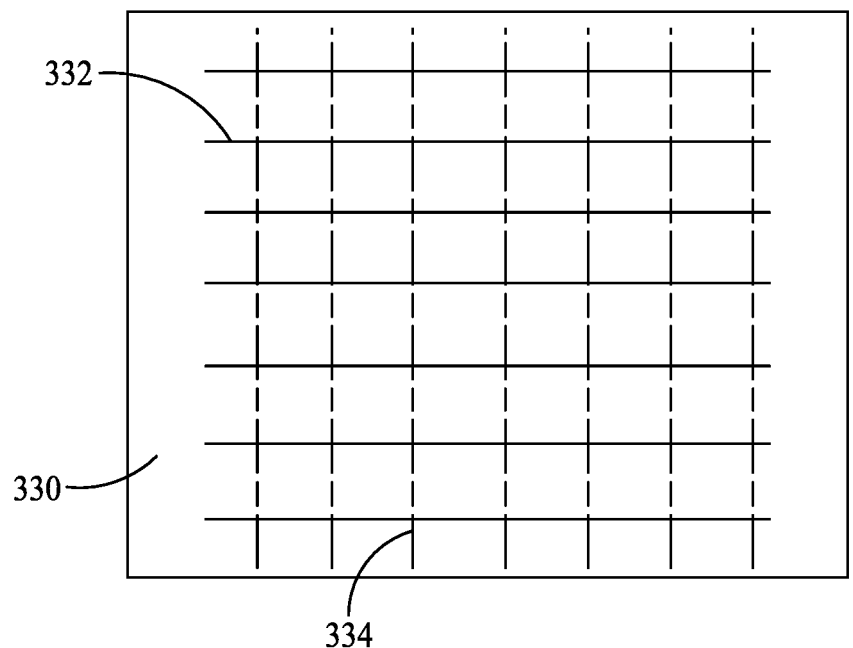
FIG. 3A shows a schematic top plan view of an isotropic high CTE substrate having high CTE structures in a first direction and low CTE structures in a second direction perpendicular to the first direction, according to certain embodiments.

As shown in FIG. 3A, the high CTE substrate 330 may include a first plurality of structures 322 extending in one direction (e.g., in the either the x direction or the y direction) constructed of a high CTE material (e.g., metal) and a second plurality of structures 334 extending in another direction (e.g., in the other of the x direction or the y direction) constructed of a low CTE material. In a non-limiting example of high and low CTE structures, ethylene ethyl acrylate (EEA) has a TCE of $205\times10^{-6}$ m/(m ° C.) and a CTE of $2\times10^{-4}$/K and Aluminum Alloy—5052 has a TCE of $23.8\times10^{-6}$ m/(m ° C.). The CTE of metals and alloys are in the range of $10\text{-}30\times10^{-6}$/K. The CTE of polymers is in the range of $0.2\times10^{-4}$ to $2.3\times10^{-4}$/K. Both the high CTE structures and low CTE structures have CTE higher than the substrate material.

Given by the equation for Linear Thermal Expansion, $L_2=L_1\alpha(t_1-t_0)$, where a is the coefficient of linear expansion, a metamaterial that is 1 cm by 1 cm in size at a 10 degree change in temperature would lead to a 23 micron change across the 1 cm surface for a thermoplastic having a equal to $2.3\times10^{-4}$K$^{-1}$. This 23 micron change would shift the lattice period by 1.15 nm. This shift in lattice spacing would typically be inconsequential for most metamaterial structures. However, if the metamaterial were to exhibit a fano resonance or if the system were to operate at an epsilon near zero point, the change in transmission/reflection/absorption could be dramatic. For this reason, utilizing structured/patterned CTE materials can help to increase the periodicity over gradual temperature changes.

If the metamaterial were composed of unit cells that were 500 nm in width, then there would be roughly 20,000 unit lattices across the surface. The change in area due to thermal expansion is $\Delta A=2\alpha A\Delta T$, where $\Delta A$ is the change in area. The change in volume due to thermal expansion is $\Delta V=\beta V\Delta T$, where $\beta$ is the coefficient of volume expansion and $\beta\approx3\alpha$. Thermal stress is created when thermal expansion is constrained.

If the metamaterial lattice were 250 nm×250 nm, the expansion per unit cell would be a 0.58 nm expansion after the 10 degree Celsius change.

A 1000 nm metamaterial lattice would undergo a 2.32 nm expansion after 10 degree Celsius change.

The expansion of the unit cells is limited by the size of the nanoparticles, which may separate from the substrate if the expansion is too great.

Figure 3B:
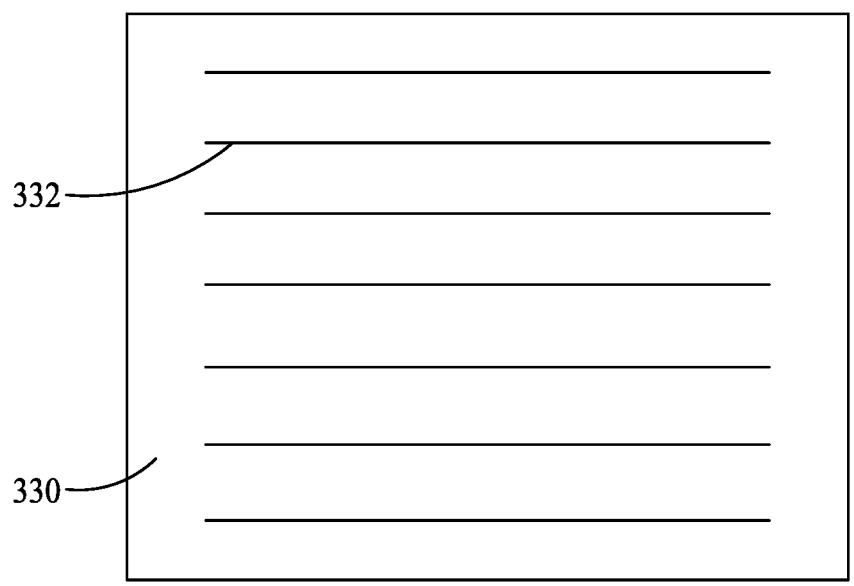
FIG. 3B shows a schematic top plan view of an anisotropic high CTE substrate having high CTE structures in a first direction, according to certain embodiments.

As shown in FIG. 3B, the CTE substrate 330 may be constructed to expand isotropically by patterning the substrate with high CTE fibers/printed structures 332 in only the length or x direction. These fibers/printed structures cause the substrate to expand with in the x direction upon application of increased temperature.

Figure 3C:
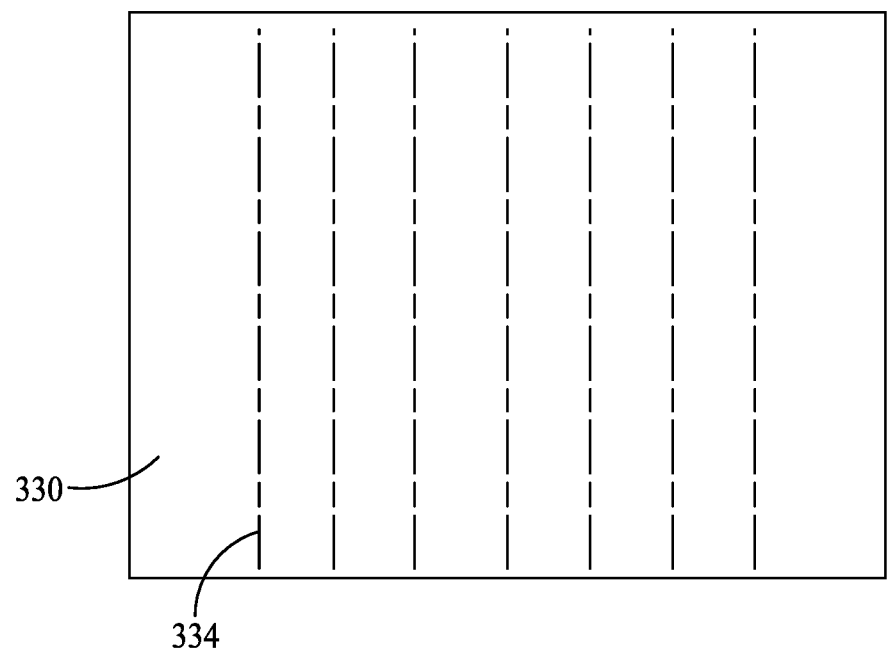
FIG. 3C shows a schematic top plan view of an anisotropic high CTE substrate having high CTE structures in a second direction, according to certain embodiments.

As shown in FIG. 3C, the CTE substrate 330 may be constructed to expand isotropically by patterning the substrate with high CTE structures 332 in only the width or y direction. These structures cause the substrate to expand in the y direction upon application of increased temperature.

Figure 3D:
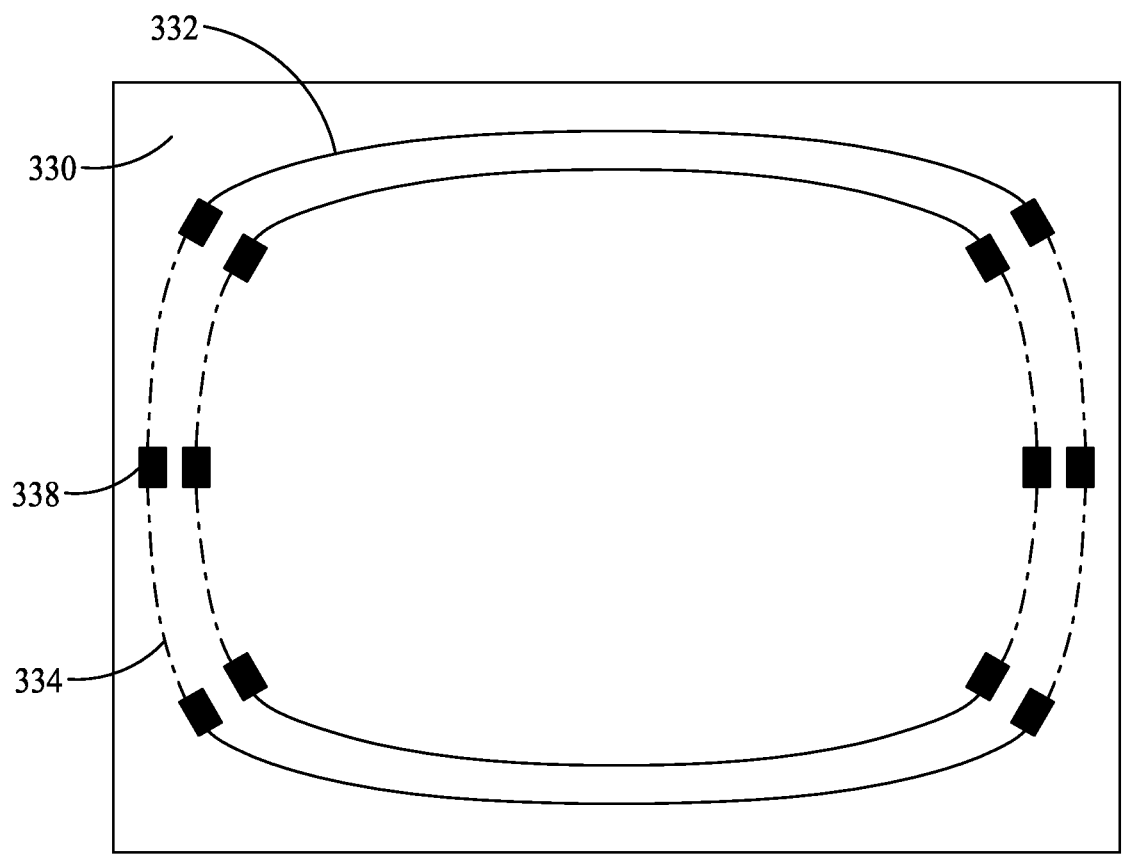
FIG. 3D shows a schematic top plan view of an anisotropic high CTE substrate having high CTE structures in a first direction and low CTE structures in a second direction forming an expansion pattern, according to certain embodiments.

The substrate may be patterned with high and low CTE structures to achieve anisotropic expansion. FIG. 3D shows an example of a pattern of high CTE structures 332 and low CTE structures 334 configured to stretch the center of the substrate 330 more in the x direction than in the y direction. Hinges 338 may be attached at joints between the high and low CTE structures. The joints may be formed of epoxy, rubber or a flexible polymer. The joints transfer the bending moments to other parts of the structure. The hinge joints help to enlarge the bending deformation, acting as linkages.

Figure 3E:
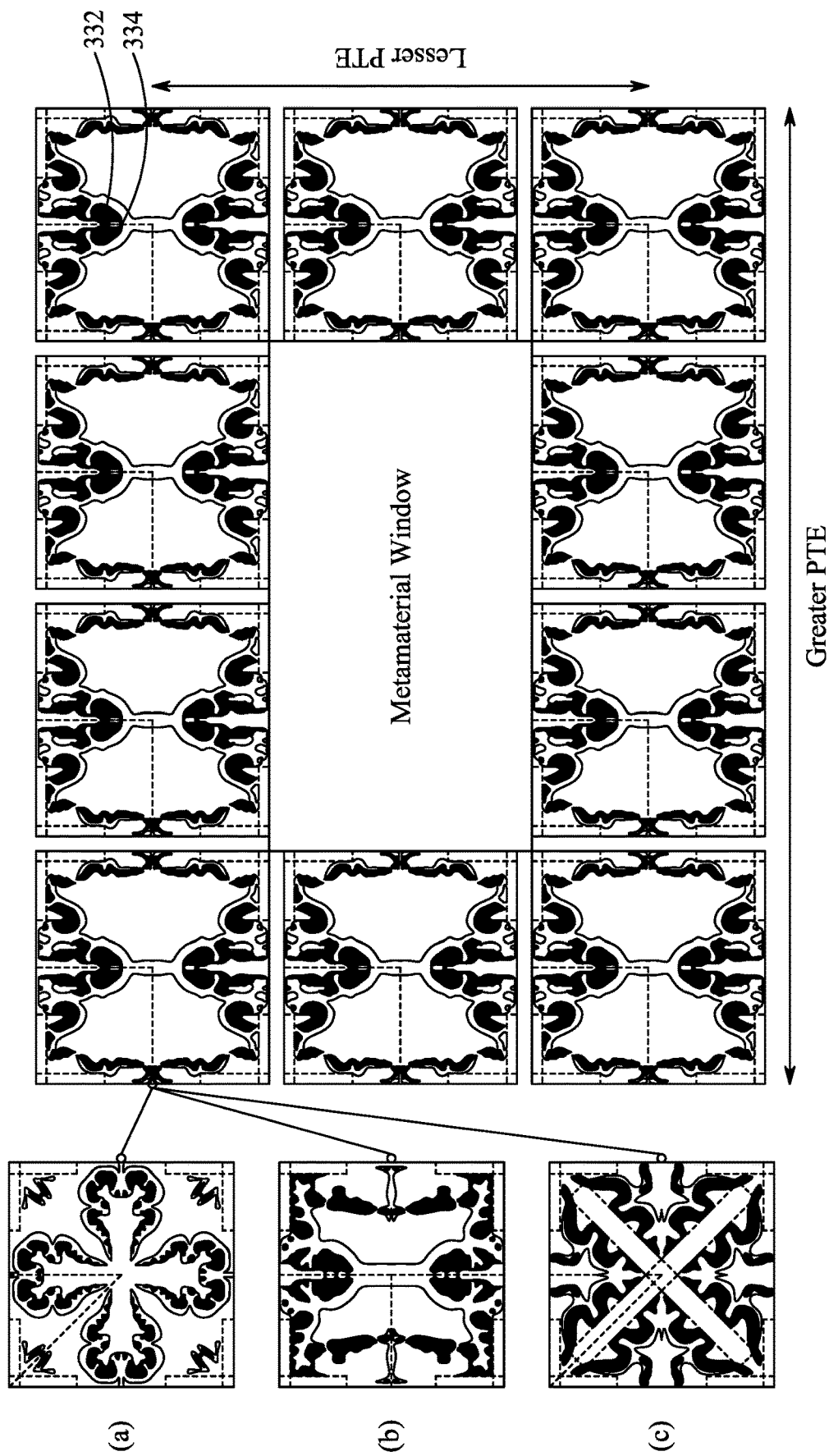
FIG. 3E depicts a metamaterial window formed on a membrane patterned with tiles having high and low CTE patterns, in which a) shows an isotropic positive thermal expansion pattern (IPTE), b) shows an anisotropic negative thermal expansion pattern (ANTE), and c) shows an isotropic negative thermal expansion pattern (INTE), according to certain embodiments.

FIG. 3E illustrates a optical metamaterial having an anisotropic pattern of positive thermal expansion materials. The metamaterial window expands under thermal heating as each of the pattern sections expands (or contracts under cooling). Some examples of high CTE and low CTE material materials which can form the expansion pattern are shown in (a), (b) and (c). In each tile, the light gray is a rigid, low CTE material 334 and the black sections are soft, high CTE material 332. FIG. 3E(a) shows a pattern of high and low CTE structures with positive thermal expansion (PTE) which isotropically (IPTE) expand the substrate material around the metamaterial window. FIG. 3E(b) shows a pattern of high and low CTE structures with negative thermal expansion (NTE) which anisotropically (ANTE) contract the substrate material around the metamaterial window. FIG. 3E(c) shows a pattern of high and low CTE structures with negative thermal expansion (NTE) which isotropically (INTE) contract the substrate material (the same in all directions) around the metamaterial window. The 3D lattice unit cell frames may be fabricated through ink-jet printing, which involves spraying a liquid photopolymer onto a build tray in thin layers, which are then exposed to UV light to solidify the photopolymer. By depositing different materials at locations defined by a multi-material design, multi-material composites can be fabricated. The fabrication of the functional parts is achieved by combining the two materials in small dots to achieve a mixing state, similar to color mixing in the paper inkjet printing process. Table 1 shows materials and properties for the 3D printing process with two high CTE photopolymers. (See: Takezawa, A.; Kobashi, M.; "Design methodology for porous composites with tunable thermal expansion produced by multi-material topology optimization and additive manufacturing", Composites Part B: Engineering, Volume 131, 15 Dec. 2017, Pages 21-29, incorporated herein by reference in its entirety).

TABLE 1

Measured Young's Modulus and CTE of two high CTE photopolymers

| | Vero White Plus RGD835 | | FLX9895-DM | |
|---|---|---|---|---|
| Temperature (° C.) | Young's Modulus (MPa) | CTE ($\times 10^{-5}$ K$^{-1}$) | Young's Modulus (MPa) | CTE ($\times 10^{-5}$ K$^{-1}$) |
| 20 | 1996.2 ± 111.2 | | 67.8 ± 2.4 | |
| 30 | 1023.3 ± 228.0 | 7.14 ± 0.85 | 13.0 ± 5.4 | 8.00 ± 1.64 |
| 40 | 288.5 ± 34.6 | 8.96 ± 1.56 | 3.8 ± 1.8 | 10.53 ± 3.10 |

The high and low CTE patterns can form preferred sensing domains when the nanoparticles are applied to the substrate. The nanoparticles can be nanospheres, nanocubes, nanotowers, nanocones, designed extruded shapes, or the like. The magnitude of the expansion (or contraction) can logically be tuned regardless of lattice periodicity by the selection of lattice/frame materials with appropriate CTEs. The high CTE substrate of the present disclosure is not limited to the patterns of FIG. 3A to FIG. 3E, and may be tailored to any type of device on which the optical metamaterial is applied. FIG. 3E illustrates a metamaterial window having CTE patterns such as those of Takezawa et al., but the patterns may be designed to meet application specifications[DEJI].

Figure 4A:
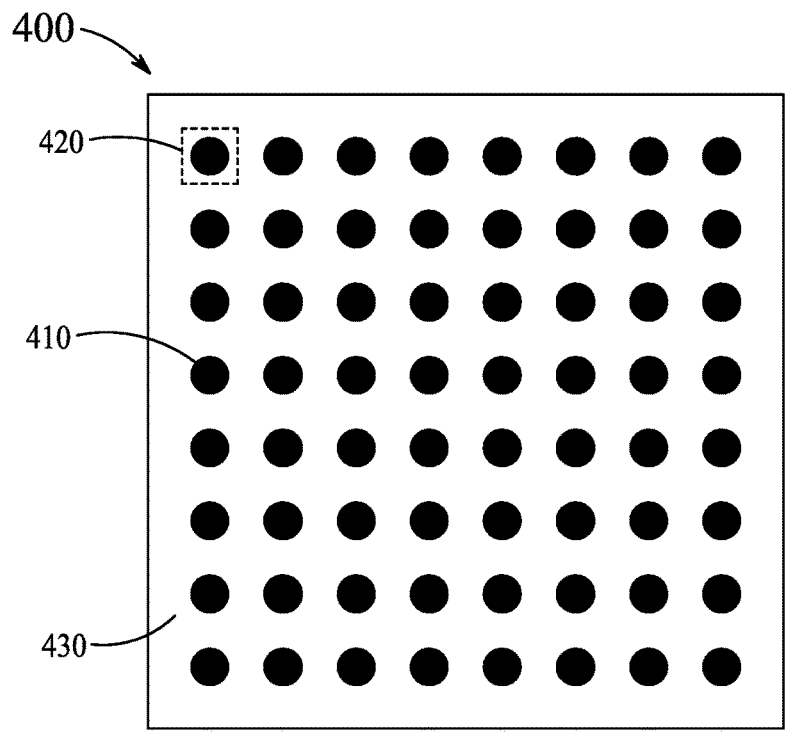
FIG. 4A shows the electroactive optical metasurface with the anisotropic pattern of high CTE structures of FIG. 3A in the inactivated mode, according to certain embodiments.

FIG. 4A shows an optical metasurface structure 400 having a high CTE substrate 430 formed of a pattern of high CTE fibers/printed structures and an array of nanoparticles 410, wherein each nanoparticle is contained in a unit cell 420. The optical metamaterial structure 400 is in its inactivated state. The fibers/printed structures of FIG. 4A-4E have positive thermal expansion (PTE) coefficients.

Figure 4B:
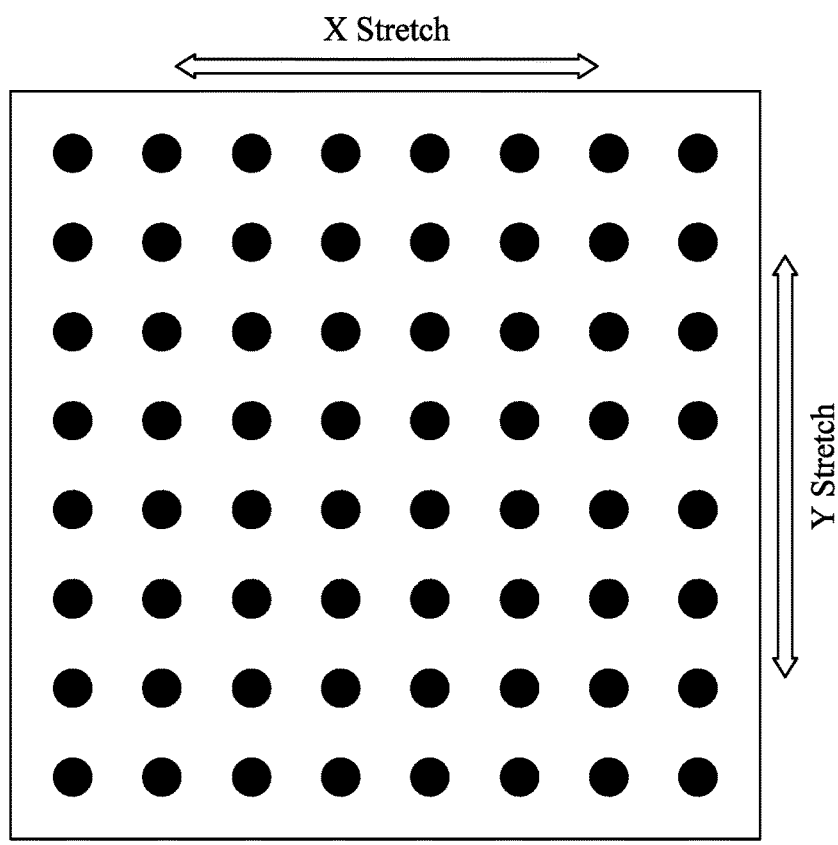
FIG. 4B shows the electroactive optical metasurface with the anisotropic pattern of high CTE structures of FIG. 3A in the activated mode, according to certain embodiments.

FIG. 4B shows the change in the lattice structure of the optical metasurface, for a substrate having the anisotropic pattern of high and low CTE fibers/printed structures shown in FIG. 3A, after heat is applied. The expansion in the x ("X stretch") direction is much greater than the expansion in the y direction ("Y stretch").

Figure 4C:
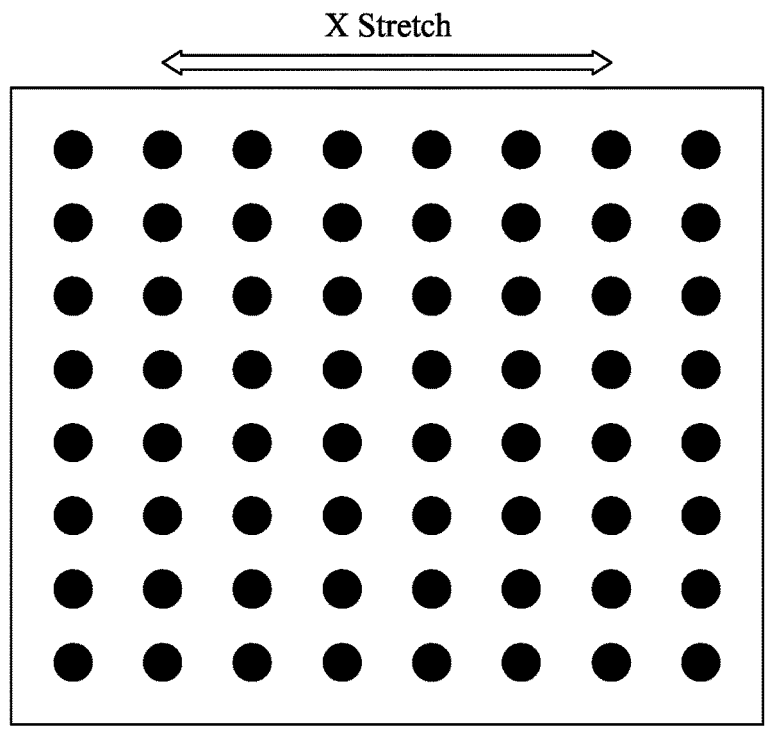
FIG. 4C shows the electroactive optical metasurface with the isotropic pattern of high CTE structures of FIG. 3B thermally expanded in the first direction, according to certain embodiments.

FIG. 4C shows the change in the lattice structure of the optical metasurface, for a substrate having the isotropic pattern of high CTE fibers/printed structures shown in FIG. 3B, after heat is applied. The expansion is only in the x direction.

Figure 4D:
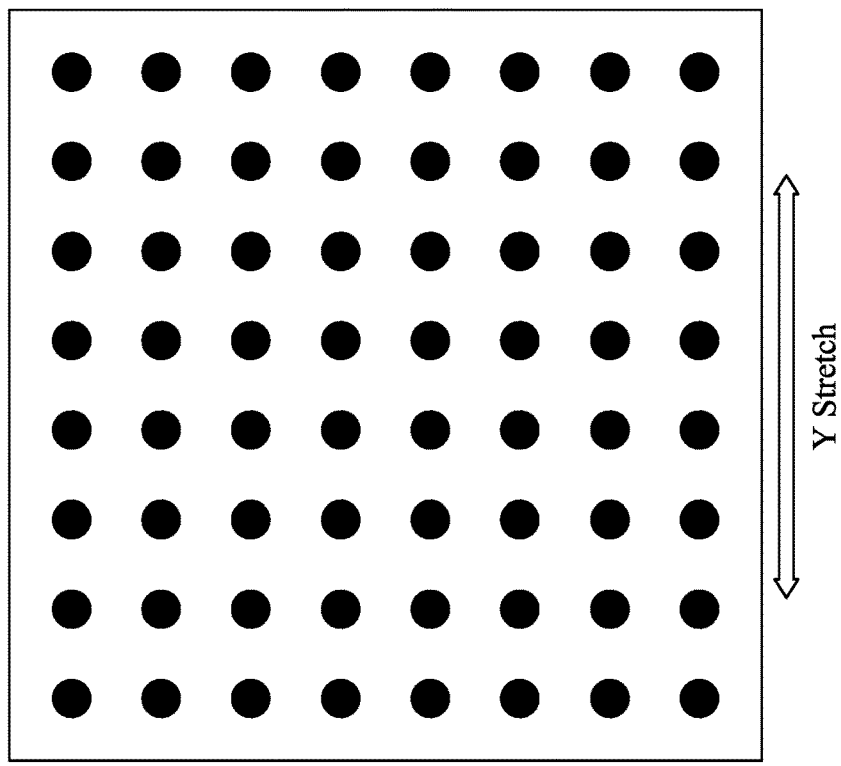
FIG. 4D shows the electroactive optical metasurface with the isotropic pattern of high CTE structures of FIG. 3C thermally expanded in the second direction, according to certain embodiments.

FIG. 4D shows the change in the lattice structure of the optical metasurface, for a substrate having the isotropic pattern of high CTE fibers/printed structures shown in FIG. 3C, after heat is applied. The expansion is only in the y direction.

Figure 4E:
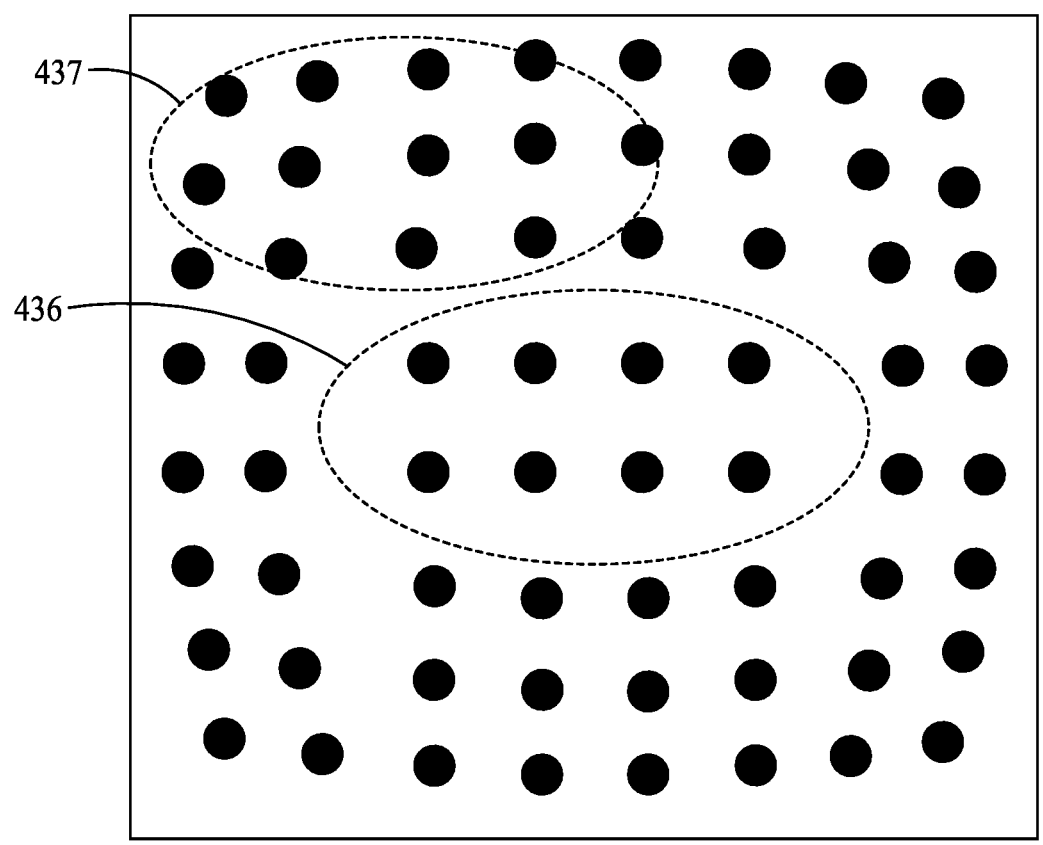
FIG. 4E shows the electroactive optical metasurface with the anisotropic pattern of high CTE structures of FIG. 3D thermally expanded, according to certain embodiments.

FIG. 4E shows the change in the lattice structure of the optical metasurface structure, for a substrate having the anisotropic pattern of CTE fibers/printed structures shown in FIG. 3D, after heat is applied. Sensing domain 436 is indicated by the dotted line ellipse. In this area, the lattice expansion is similar to that of FIG. 4B. However, in domain 437, for example, the lattice is distorted. Light applied to this area may increase the fano resonance or the area may be designed to preferentially resonate light from a different angle of incidence than the angle of incidence sensed in domain 436. This may be advantageous if the optical metasurface structure is applied to a solar cell, where the angle of incidence and frequency of sunlight changes over the course of the day.

The optical metasurface can be used in many different optical applications. In some applications, light, such as a laser, may be directed through the structure to select a desired frequency of the light or eliminate scattering. The metamaterial may resonate at a frequency defined by the lattice spacing. The spacing can be adjusted by the application of heat to tune the resonant frequency.

Alternatively, the light may be directed to impinge on the lattice structure from above, and be reflected or scattered. The reflected or scattered light may exhibit fano resonance.

Each nanoparticle has a plasmonic resonance, because incident light can excite a surface wave. When the nanoparticles are close enough to each other, the fields from neighboring particles (cells) can interact, producing a magnetic resonance. In a circuit analogy, the gaps between the nanoparticles act like capacitors, and the nanoparticles themselves like inductors. The gaps between the particles are only a few nanometers. If the gaps are too large, the coupling between the nanoparticles is too weak to give a strong magnetic response.

Fano resonance occurs from coupling of two oscillators with strongly different damping rates producing narrow and broad spectral lines. The Fano resonance line-shape is due to interference between two scattering amplitudes, one due to scattering within a continuum of states (the background process) and the second due to an excitation of a discrete state (the resonant process). The energy of the resonant state must lie in the energy range of the continuum (background) states for the effect to occur. Near the resonant energy, the background scattering amplitude typically varies slowly with energy while the resonant scattering amplitude changes both in magnitude and phase quickly. It is this variation that creates the asymmetric fano resonant profile.

For the optical metamaterial of the present disclosure, the spectral response may include a fano resonance due to reflections and scattering by the high and low CTE fibers/printed structures and the substrate material and the resonant signal response due to reflections and scattering by the nanoparticles of the unit cells. Heating of the high CTE substrate may tune the lattice spacing to eliminate or diminish the fano resonance peak.

Referring back to FIG. 1B, for the 1 cm metamaterial on ethylene ethyl acrylate, the change would be on the order of 10 nm which would be substantial enough to affect the fano resonance of a metamaterial.

Recently, a new class of materials with a vanishing permittivity, known as epsilon-near-zero (ENZ) materials, has been reported to exhibit unprecedented ultrafast nonlinear efficiencies within sub-wavelength propagation lengths. The permittivity of a material is denoted by the Greek letter c (epsilon) and is a measure of the electric polarizability of a dielectric material. Dielectrics polarize more in response to an applied electric field than a material with low permittivity, thereby storing more energy in the material. Negative permittivity means that the electric displacement vector and the electric field vector point in the opposite directions but it does not necessary mean that the electric energy stored is such medium is negative.

The CTE metamaterial of the present disclosure could be utilized to modify materials to demonstrate modulation of ENZ properties. The CTE structure could help to shift the ENZ structure on and off resonance by applying nanometer shifts in the periodic lattice of the material. As epsilon near zero materials are often operated on a narrow bandwidth, modifying the structure on and off the resonance could allow for binary ON and OFF applications of these ENZ materials.

Surface plasmon resonance (SPR) is the resonant oscillation of conduction electrons at the interface between negative and positive permittivity material stimulated by incident light. SPR is the basis of many standard tools for measuring adsorption of material onto planar metal (typically gold or silver) surfaces or onto the surface of metal nanoparticles. The surface plasmon polariton is a non-radiative electromagnetic surface wave that propagates in a direction parallel to the negative permittivity/dielectric material interface. Since the wave is on the boundary of the conductor and the external medium (air, water or vacuum for example), these oscillations are very sensitive to any change of this boundary, such as the adsorption of molecules to the conducting surface.

In order for the electronic surface plasmons to exist, the real part of the dielectric constant of a conductor must be negative and its magnitude must be greater than that of the dielectric. This condition is met in the infrared-visible wavelength region for air/metal interfaces (where the real dielectric constant of a metal is negative and that of air or water is positive).

LSPRs (localized surface plasmon resonances) are collective electron charge oscillations in metallic nanoparticles that are excited by light. They exhibit enhanced near-field amplitude at the resonance wavelength. This field is highly localized at the nanoparticle and decays rapidly away from the nanoparticle/dieletric interface into the dielectric background, though far-field scattering by the particle is also enhanced by the resonance.

Light intensity enhancement is a very important aspect of LSPRs and localization means the LSPR has very high spatial resolution (subwavelength), limited only by the size of nanoparticles. Because of the enhanced field amplitude, effects that depend on the amplitude such as magneto-optical effect are also enhanced by LSPRs.

Terahertz (THz) radiation has a frequency of 0.1-10 THz, is located between the microwave and the infrared in the electromagnetic spectrum, and is in the transition region from electronics to photonics. The optical metasurfaces of the present disclosure can tune the resonance of the terahertz waveband through control of the environmental temperature.

The optical metamaterial can be fabricated by stencil lithography, shadow nanosphere lithography or by additive manufacturing, such as 3D printing. In some embodiments, the high CTE substrate may be fabricated by 3D printing the high and low CTE fibers/printed structures on a polymer membrane, such as PDMS. The high and low CTE fibers/printed structures may run in one or more directions or in patterns, as discussed previously with respect to FIG. 3A to 3E. The fibers/printed structures may be selected from high CTE materials, such as carbon fiber, copper wires, fiber composites, EEA, aluminum alloy, high CTE polymers, and the like.

In an aspect, the nanoparticles (sphere, cubes, cones, or the like) can be applied by stencil or shadow nanosphere lithography.

In an aspect, in order to fabricate the nanostructure layer (such as nanospheres, nanocubes, or the like), the nanostructures can be deposited on a substrate, such as $SiO_2$, $SiTiO_2$ or $AlO_2$. The substrate is then etched to make a lattice of nanomaterials. There is no hard substrate.

In an aspect, a CTE fiber mat is embedded in the membrane material, a layer of printed nanostructures is applied and a transparent polymer layer may be applied to encase the optical metamaterial device. The array of nanostructures, can be embedded in the 3D printed high CTE layer.

In another aspect, for large area patterning, stencil lithography can be used. A stencil is aligned and fixed to a substrate. The stencil-substrate pair is placed in an evaporation/etching/ion implantation machine, and after the processing is done, the stencil is simply removed from the now patterned substrate. In a further aspect, shadow nanosphere lithography can be used to deposit the nanoparticles for small area patterning.

The high CTE substrate is a stretchable membrane. A frame can be placed around the optical metamaterial to hold the stretchable membrane taut and may keep the membrane taut by springs or the like.

FIG. 5A-5G show the effect on the spectral peaks due to the expansion of the optical metamaterial due to thermal heating.

Figure 5A:
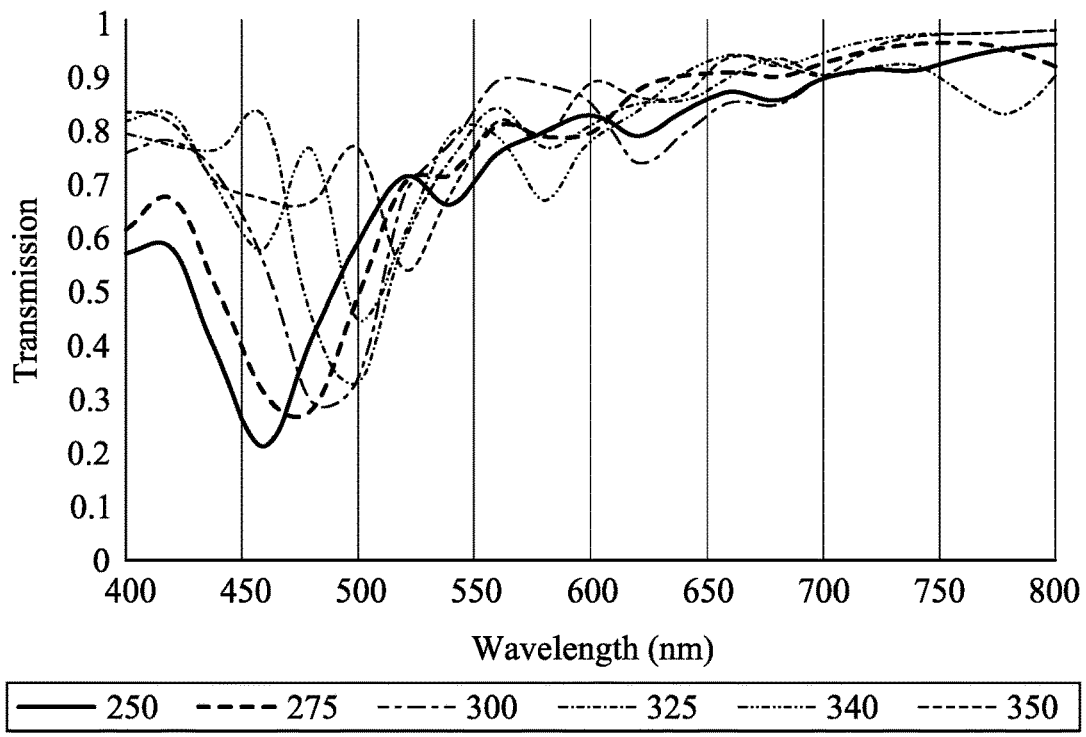
FIG. 5A shows (a) the comparison of the red shifts in the visible spectrum curves for light transmitted through the optical metastructure window of different optical metastructure lattice periods under thermal heating, according to certain embodiments.

FIG. 5A shows the comparison of the red shifts in the visible spectrum curves for light transmitted through the optical metastructure window of different optical metastructure lattice periods under thermal heating.

Figure 5B:
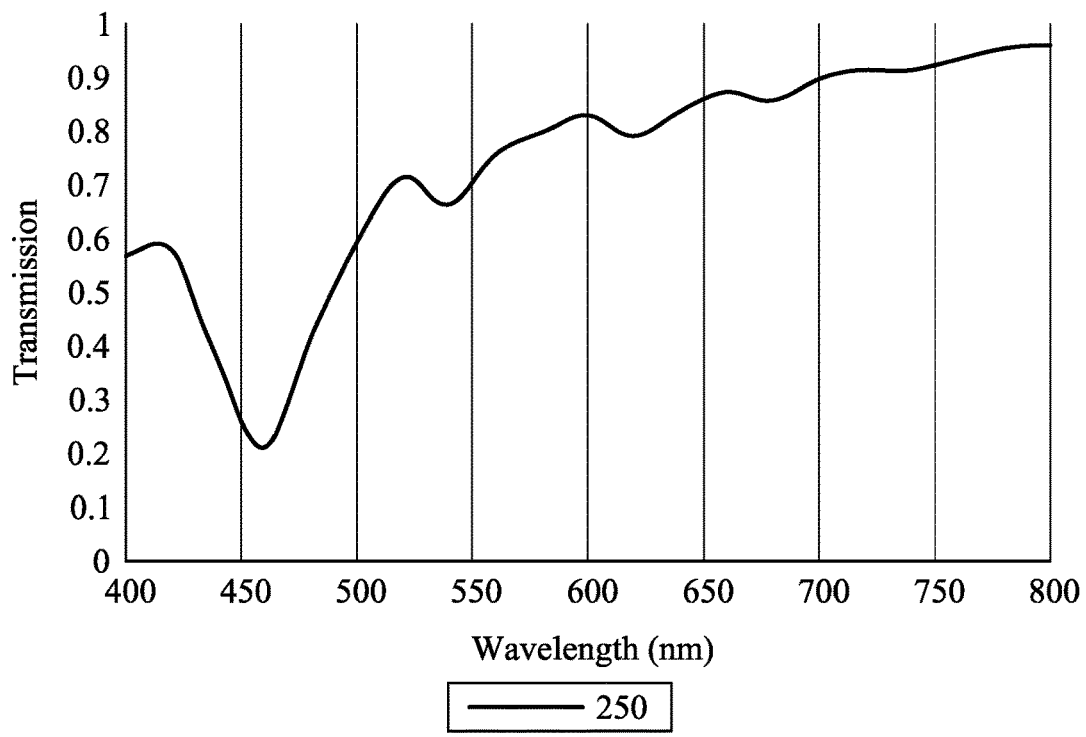
FIG. 5B shows the shift in the spectral transmission curve to a period of 250 s under thermal heating, according to certain embodiments.

FIG. 5B shows the shift in the spectral transmission curve for a lattice period of 250 nm under thermal heating.

Figure 5C:
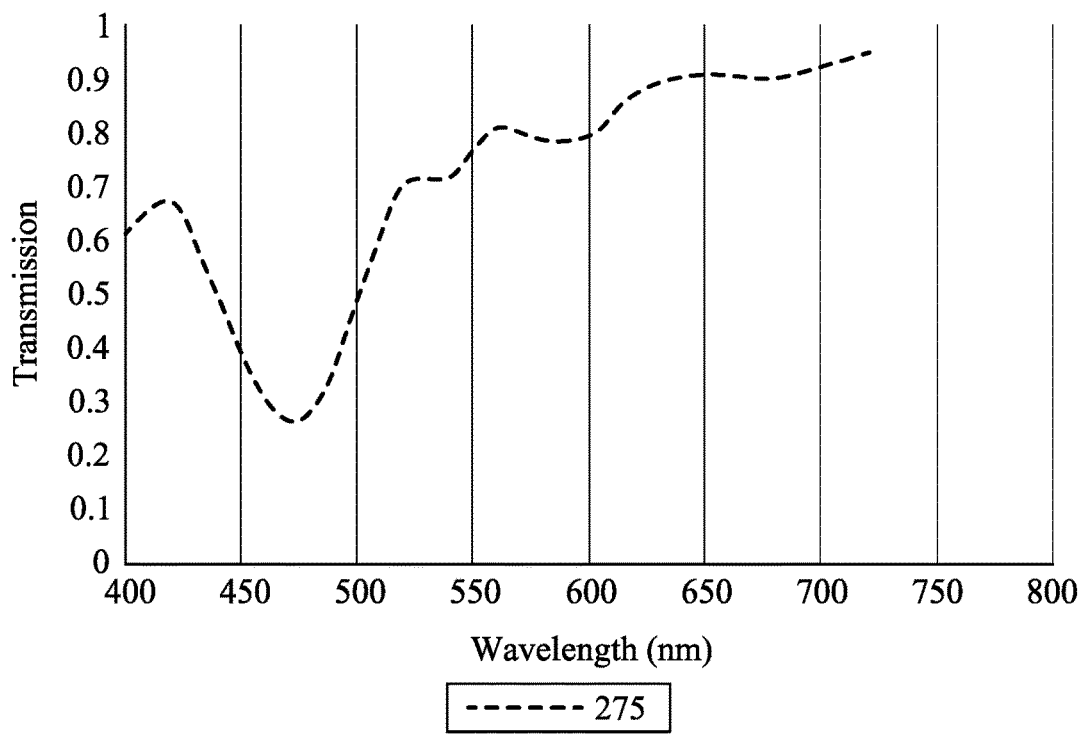
FIG. 5C shows shift in the spectral transmission curve to a period of 275 s under thermal heating, according to certain embodiments.

FIG. 5C shows the shift in the spectral transmission curve for a lattice period of 275 nm under thermal heating.

Figure 5D:
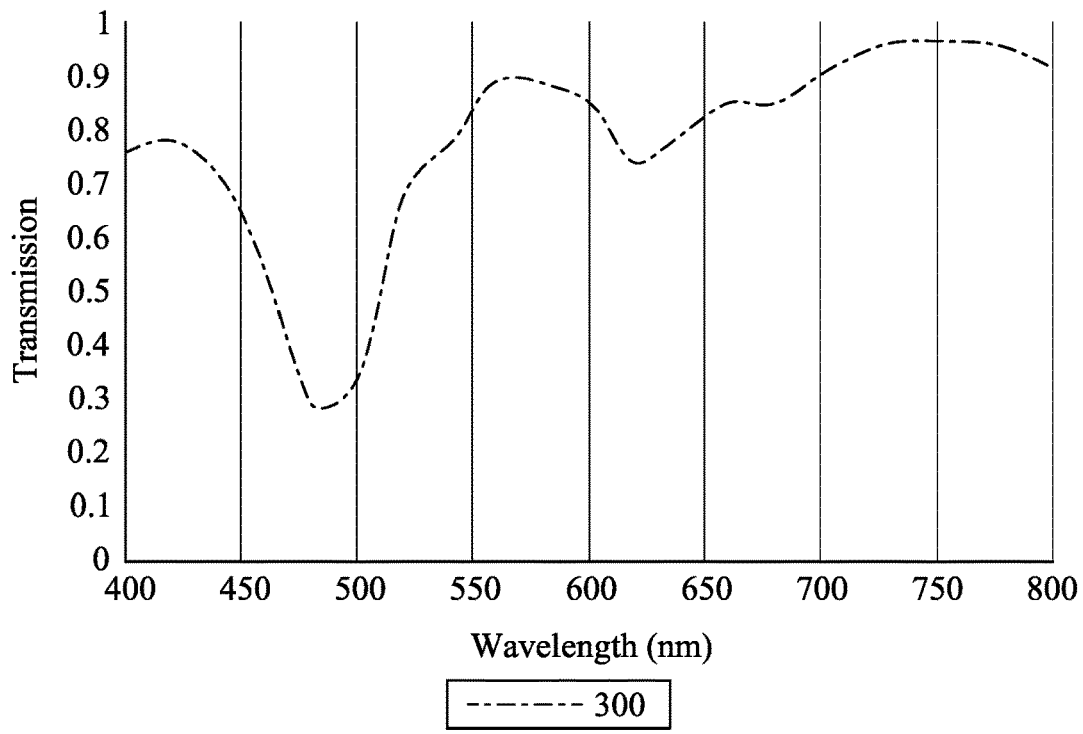
FIG. 5D shows the shift in the spectral transmission curve to a period of 300 s under thermal heating, according to certain embodiments.

FIG. 5D shows the shift in the spectral transmission curve for a lattice period of 300 nm under thermal heating.

Figure 5E:
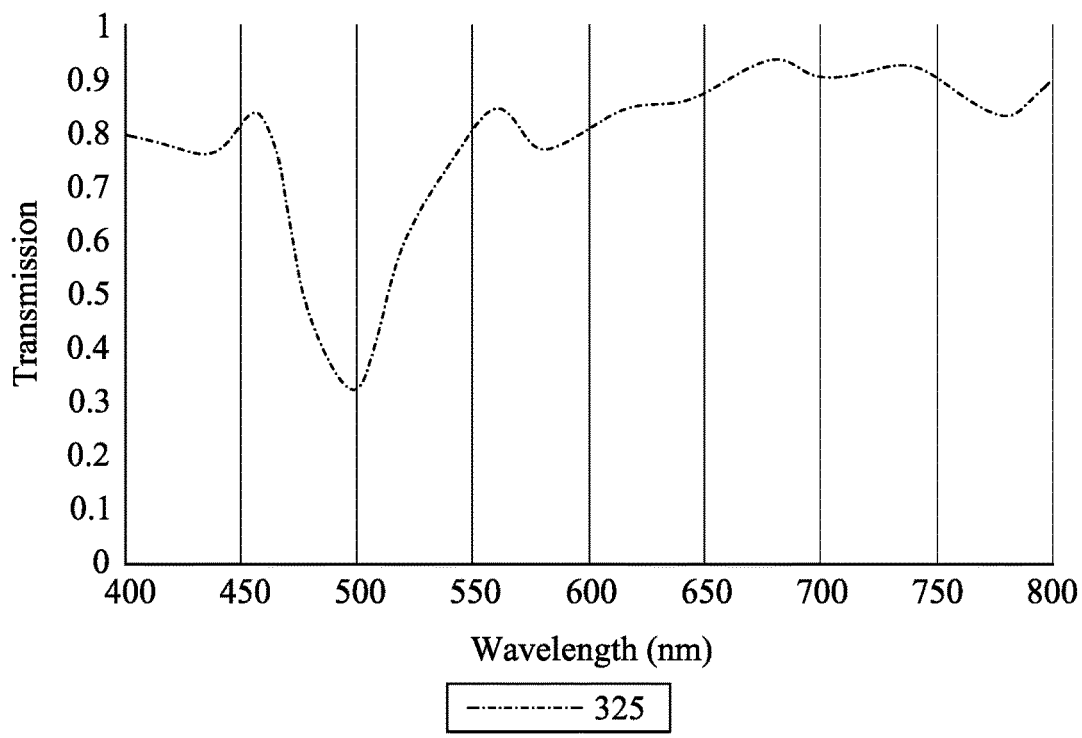
FIG. 5E shows the shift in the spectral transmission curve to a period of 325 s under thermal heating, according to certain embodiments.

FIG. 5E shows the shift in the spectral transmission curve for a lattice period of 325 nm under thermal heating.

Figure 5F:
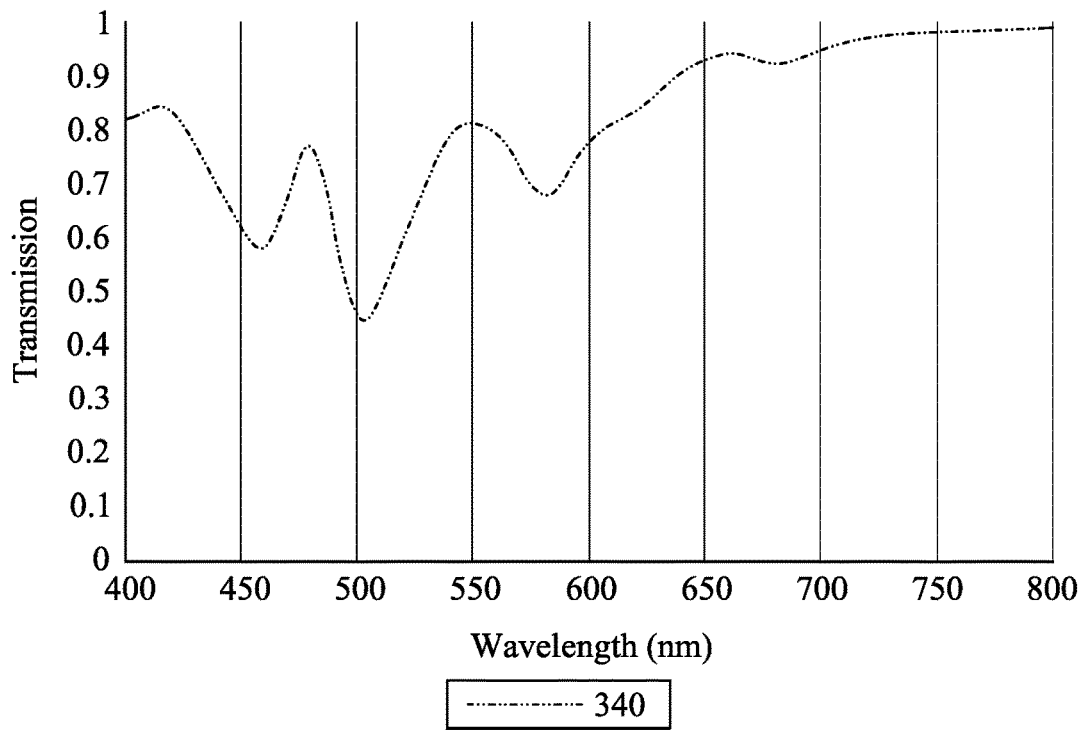
FIG. 5F shows the shift in the spectral transmission curve to period of 340 s under thermal heating, according to certain embodiments.

FIG. 5F shows the shift in the spectral transmission curve for a lattice period of 340 nm under thermal heating.

Figure 5G:
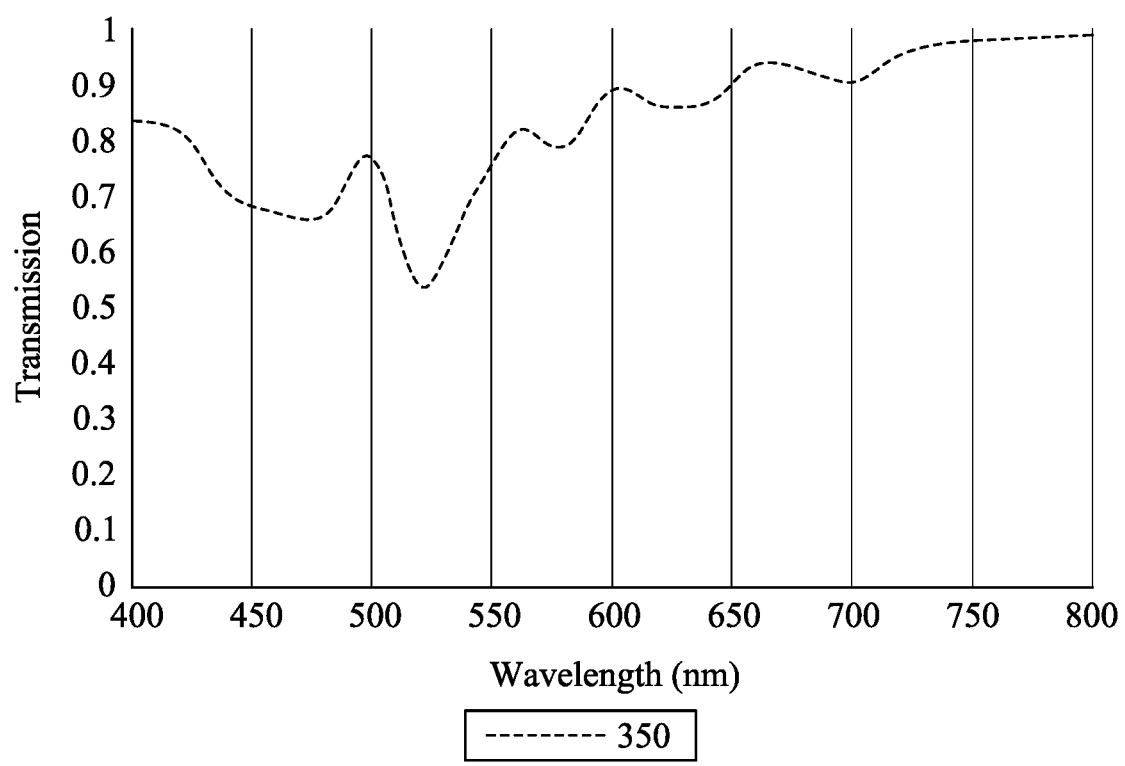
FIG. 5G shows the shift in the spectral transmission curve to a period of 350 s under thermal heating, according to certain embodiments.
Figure 6:
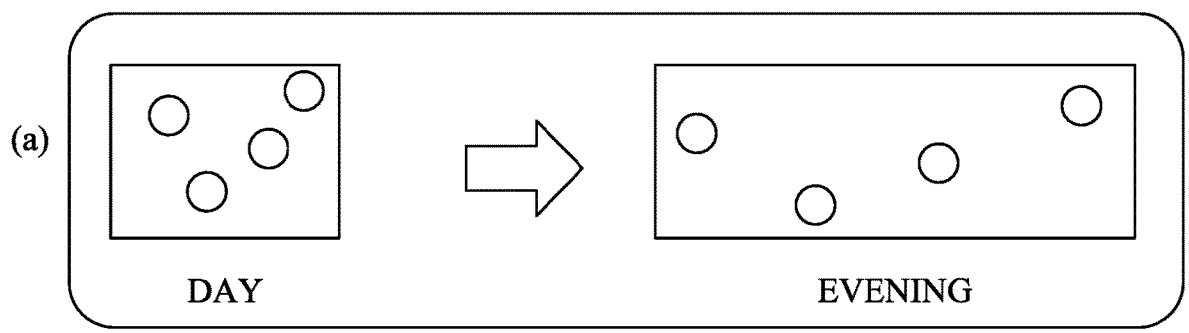
FIG. 6 illustrates (a) an inactivated to activated state due to thermal heating by sunlight from day to night hours, (b) the spectral absorption/reflection/transmittance of the metamaterial at the two locations where it expands/contracts, and (c) the changes in intensity of light from the environment at two different periods of the day, according to certain embodiments.
Figure 6:
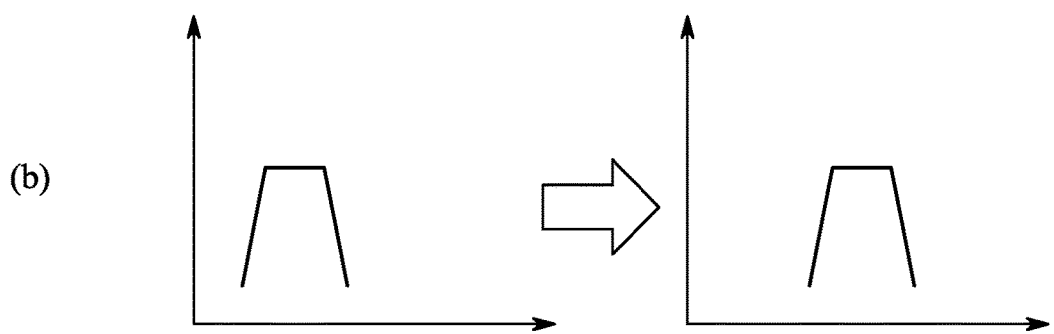
Figure 6:
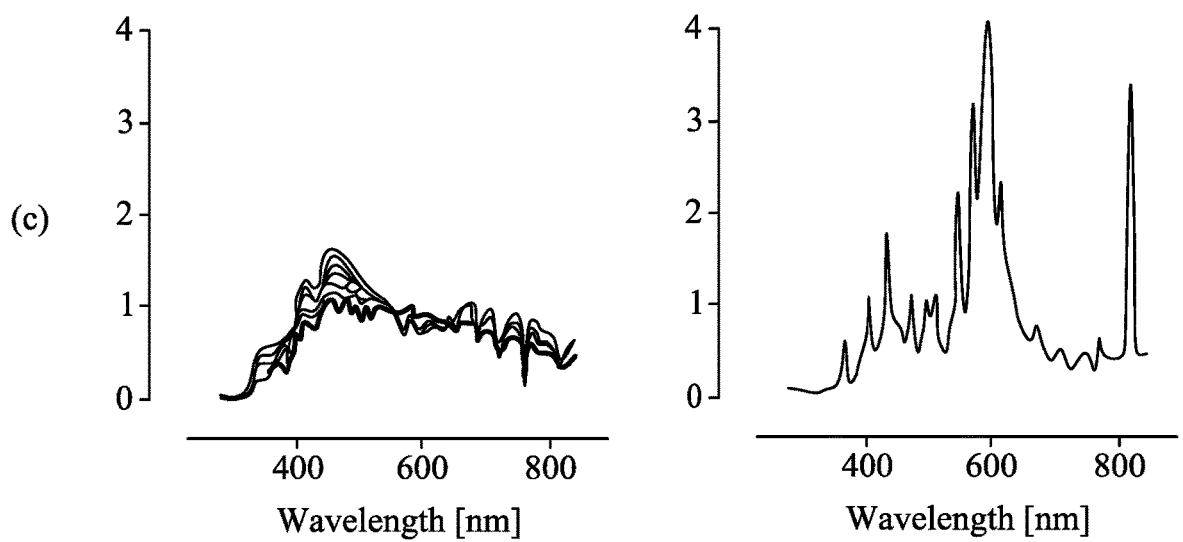

FIG. 5G shows the shift in the spectral transmission curve for a lattice period of 350 nm under thermal heating, according to certain embodiments During the course of the day, sunlight shifts from the blue spectrum to the red spectrum. FIG. 6(a) depicts the stretching of an optical metamaterial due to solar warming. As shown in FIG. 6(b), the resonance peak red shifts from day to night. FIG. 6(c) shows a resonance peak at about 500 nm and a relatively constant response (of "1") from 400 nm to 800 nm during the course of the day. However, late in the day or at night, the expansion of the membrane captures the red shifted light and provides a large resonance peak (of "4") at 600 nm. If the optical metamaterial is attached to a solar cell, an array of solar cells or used to filter light onto a solar panel, the device may be able to continue to capture sunlight and generate electricity well into the evening hours.

Figure 2C:
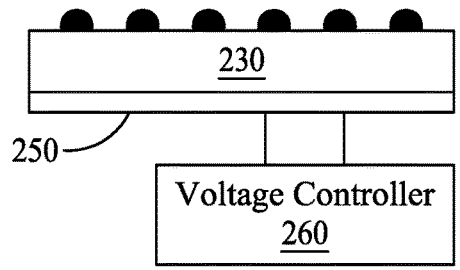
FIG. 2C shows a cross-sectional view of the electroactive optical metasurface having a resistive heating layer, according to certain embodiments.
Figure 2D:
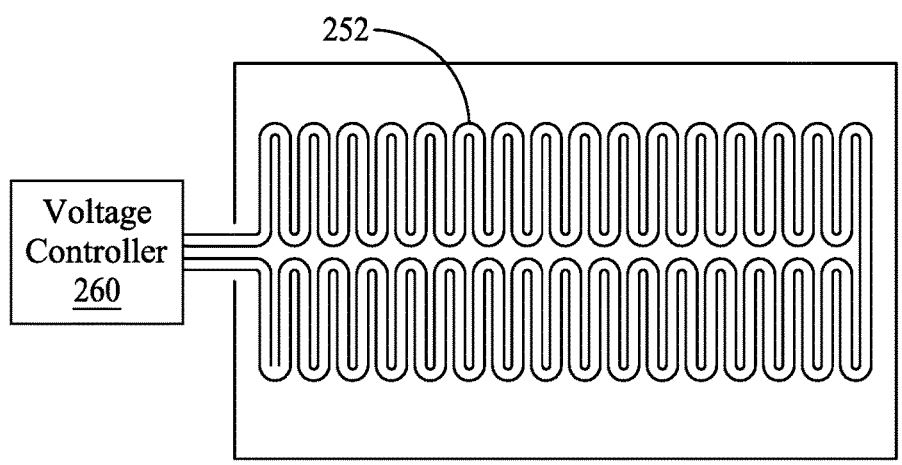
FIG. 2D shows a top plan view of the resistive layer, according to certain embodiments.

The optical metamaterial of the present disclosure may be applied to a substrate with patterned resistive wiring as shown in FIGS. 2C and 2D. Depending on whether the CTE materials have negative or positive thermal expansion characteristics, the lattice spacing of the pattern may decrease or increase respectively under thermal heating. Additionally, a substrate printed with positive expansion CTE materials may contract under thermal cooling. The thermal cooling may be applied by a cooling fan, a water bath, or the like or be due to changes in ambient temperature from day to night or due to seasonal changes.

In an aspect of the present disclosure, the optical metamaterial may have a printed layer of gold interdigitated finger wiring 720 instead of the nanostructures as described by Lan et al. (See: Lan, S; Rodrigues, S., Taghinejad, M.; Cai, W; "Dark plasmonic modes in diatomic gratings for plasmoelectronics", Mar. 10, 2017, published in Laser & Photonic Reviews, incorporated herein by reference in its entirety.

Figure 7A:
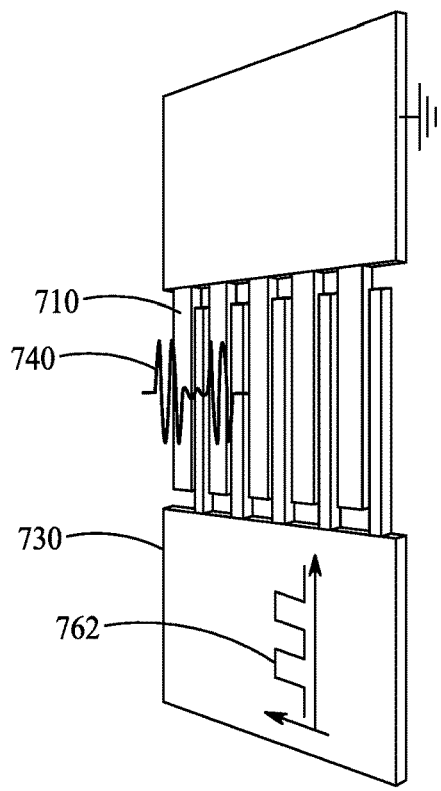
FIG. 7A illustrates an optical device with interdigitated fingers which can be spread apart or contracted by thermal heating, according to certain embodiments.
Figure 7B:
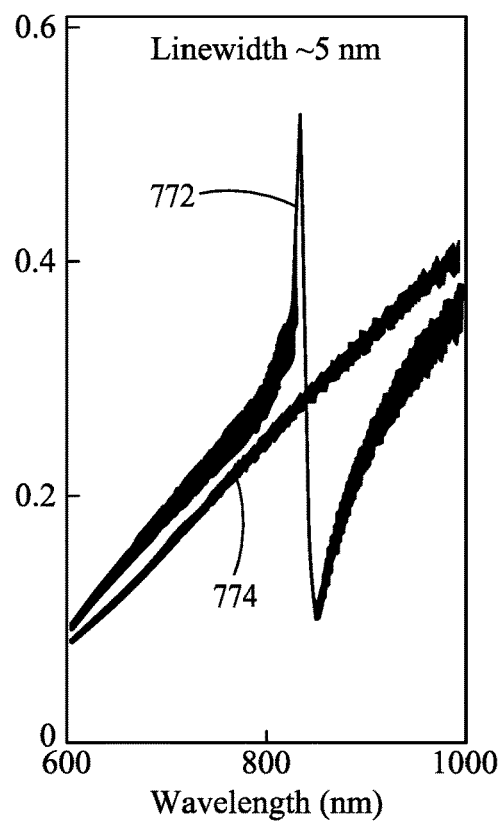
FIG. 7B illustrates the spectral response showing a fano resonance curve, according to certain embodiments.

In this aspect, the high CTE substrate 730 is applied to the resistive wiring layer of FIG. 2C and a voltage controller (not shown in FIG. 7A) provides a voltage signal 762 to the resistive wiring to heat the high CTE substrate. As the high CTE substrate is heated, the interdigitated fingers spread apart. A laser beam 740 applied across the interdigitated fingers can be tuned by the change in temperature. FIG. 7B shows the spectral response having a fano resonance curve 772 and a resonant response 774. Thermally changing the distance between the interdigitated fingers can tune the optical metamaterial so that the fano resonance curve 772 is eliminated. This structure provides an optical on/off switch based on the temperature applied and acts as a binary temperature thermometer. This structure could be especially helpful in measuring temperatures on quantum chips, where there is little ability to operate off a specific temperature.

The optical metamaterials of the present disclosure may be adapted for use in telecom applications, to filter laser signals, in subdiffraction imaging, to sensing applications, to invisibility cloaks, or the like.

Figure 8:
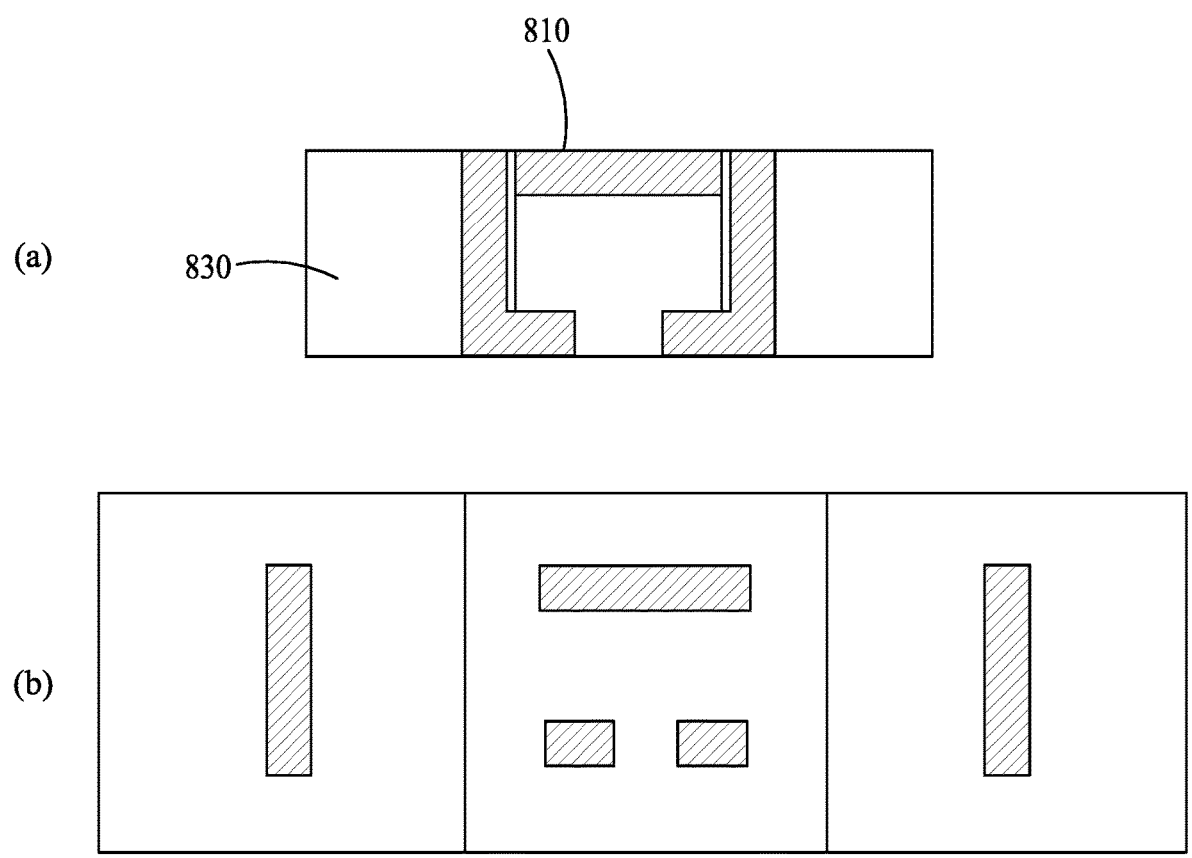
FIG. 8 illustrates (a) a split ring resonator using the optical metasurface and (b) its off state, according to certain embodiments.

Split ring resonators (SRR) are optical nanostructures that have received a lot of attention for their ability to support magnetic resonance and for their potential use as materials with negative dielectric constant. FIG. 8 illustrates an aspect of the present disclosure which provides a split ring resonator with on/off resonance. FIG. 8(a) shows the high CTE substrate patterned as a split ring resonator. FIG. 8(b) shows that the resonator can be turned off by application of heat to the high CTE substrate, which pulls apart the split ring resonator wiring 810.

In an aspect of the present disclosure, the optical metasurfaces may be used as haptic devices, which can be activated by temperature changes rather than touching or stretching.

Obviously, numerous modifications and variations of the present invention are possible in light of the above teachings. It is therefore to be understood that within the scope of the appended claims, the invention may be practiced otherwise than as specifically described herein.

The invention claimed is:

1. An optical metasurface comprising:
   a membrane;
   a first plurality of structures having a first coefficient of thermal expansion (CTE) embedded in the membrane in a first pattern, wherein the first CTE is in the range of $0.2 \times 10^4$ to $2.3 \times 10^{-4}$/K;
   a second plurality of structures having a second CTE embedded in the membrane in a second pattern, wherein the second CTE is in the range of $-1 \times 10^{-6}$/K to $+8 \times 10^{-6}$/K; and
   an array of nanostructures deposited on the membrane over the first and second plurality of structures.

2. The optical metasurface of claim 1, comprising:
   a resistive wiring layer attached to the membrane opposite the array of nanostructures.

3. The optical metasurface of claim 2, comprising:
   a voltage controller connected to the resistive wiring layer, the voltage controller configured to provide an electrical current to the resistive wiring layer.

4. The optical metasurface of claim 1, wherein the array of nanostructures is formed from any one of nanospheres, nanocubes, nanotowers, nanocones and extruded nanomaterials.

5. The optical metasurface of claim 1, wherein the nanostructures are formed of an inorganic resonator selected from the group consisting of plasmonic metal, alumina, titanium dioxide, silicon, gold, and silver.

6. The optical metasurface of claim 1, wherein the nanostructures are organic nanostructures.

7. The optical metasurface of claim 6, wherein the organic nanostructures are formed from poly [1, 2-dithiole-3-thion-4(5)-thio]:poly (styrenesulfonate) (PDTT: PSS).

8. The optical metasurface of claim 1, wherein the membrane is polydimethylsiloxane (PDMS).

9. The optical metasurface of claim 1,
   wherein the first pattern extends in a first direction and the second pattern extends in a second direction perpendicular to the first direction.

10. The optical metasurface of claim 9,
    wherein the first pattern and the second pattern are connected by flexible polymer hinges.

11. The optical metasurface of claim 1,
    wherein the first plurality of structures and the second plurality of structures are configured to expand the array of nanostructures when subjected to increasing temperature.

12. The optical metasurface of claim 1,
    wherein the first plurality of structures and the second plurality of structures are configured to contract the array of nanostructures when subjected to increasing temperature.

13. The optical metasurface of claim 1, further comprising:
    a solar cell attached to the membrane opposite the array of nanostructures.

14. The optical metasurface of claim 1,
    wherein the array of nanostructures form a third pattern of interdigitated fingers configured to reflect light which impinges on the nanostructures at a resonant frequency; and wherein an application of thermal heat to the membrane spreads the interdigitated fingers and changes the resonant frequency.

15. The optical metasurface of claim 1, wherein the nanostructures form a split ring resonator configured to turn off with increasing temperature.

16. The optical metasurface of claim 1, wherein the nanostructures form variable focal lenses which change focal point with changes in temperature.

17. A method of tuning a resonant frequency, comprising:
irradiating an optical metasurface including an array of nanostructures embedded in a membrane with a light, wherein the membrane includes a first material having a coefficient of thermal expansion (CTE) in the range of $0.2 \times 10^{-4}$ to $2.3 \times 10^{-4}$/K, formed in a first pattern and a second material having a CTE in the range of $-1 \times 10^{-6}$/K to $+8 \times 10^{-6}$/K, formed a second pattern;
capturing the light reflected from the array;
measuring a frequency response of the light reflected from the array;
identifying a resonant frequency; and
tuning the resonant frequency by heating the membrane to change a spacing of the array.

18. A method of fabricating an optical metasurface, comprising:
3D printing a first pattern from a first material having a first coefficient of thermal expansion (CTE), wherein the first CTE is in the range of $0.2 \times 10^{-4}$ to $2.3 \times 10^{-4}$/K;
3D printing a second pattern from a second material having a second CTE, wherein the second CTE is in the range of $-1 \times 10^{-6}$/K to $+8 \times 10^{-6}$/K;
encasing the first pattern and second pattern in a membrane; and
depositing an array of nanostructures on the membrane.

19. The method of claim 18, further comprising:
forming a resistive wiring layer on the membrane opposite the array of nanostructures;
connecting a voltage controller to the resistive wiring layer, wherein the voltage controller is configured to provide an electrical current to the resistive wiring layer.

20. The method of claim 18, further comprising:
printing the first pattern in a first direction; and
printing the second pattern in a second direction perpendicular to the first direction.

* * * * *